(12) United States Patent
Li

(10) Patent No.: US 10,861,646 B2
(45) Date of Patent: Dec. 8, 2020

(54) MOTOR DRIVING DEVICE

(71) Applicant: Yueh-Han Li, Guanshan Township (TW)

(72) Inventor: Yueh-Han Li, Guanshan Township (TW)

(*) Notice: Subject to any disclaimer, the term of this patent is extended or adjusted under 35 U.S.C. 154(b) by 0 days.

(21) Appl. No.: 16/409,271

(22) Filed: May 10, 2019

(65) Prior Publication Data

US 2019/0355515 A1 Nov. 21, 2019

(30) Foreign Application Priority Data

May 16, 2018 (TW) .............................. 107116690 A

(51) Int. Cl.
| | | |
|---|---|---|
| *H05K 5/00* | (2006.01) | |
| *H01G 2/10* | (2006.01) | |
| *H01G 2/04* | (2006.01) | |
| *H01G 4/38* | (2006.01) | |

(52) U.S. Cl.
CPC ............... *H01G 2/106* (2013.01); *H01G 2/04* (2013.01); *H01G 2/103* (2013.01); *H01G 4/385* (2013.01)

(58) Field of Classification Search
CPC ...................................................... H05K 5/00
See application file for complete search history.

(56) References Cited

U.S. PATENT DOCUMENTS

| | | | | |
|---|---|---|---|---|
| 2011/0051371 A1* | 3/2011 | Azuma | ................. | H01L 25/072 361/699 |
| 2012/0250236 A1 | 10/2012 | Qiu et al. | | |
| 2014/0146449 A1* | 5/2014 | Leon | .................... | H05K 5/0004 361/679.01 |

FOREIGN PATENT DOCUMENTS

| | | |
|---|---|---|
| CN | 204497066 U | 7/2015 |
| CN | 204886855 U | 12/2015 |
| CN | 207082432 U | 3/2018 |
| EP | 2509402 A1 | 10/2012 |
| EP | 2851913 A1 | 3/2015 |

OTHER PUBLICATIONS

Search Report issued in Taiwanese Patent Application No. 107116690, dated Aug. 27, 2018.
Search Report issued in Taiwanese Patent Application No. 107116690, dated Jan. 19, 2019.
Search Report issued in European Patent Application No. 19173979. 6, dated Sep. 11, 2019.

* cited by examiner

*Primary Examiner* — Jerry Wu
(74) *Attorney, Agent, or Firm* — Birch, Stewart, Kolasch & Birch, LLP

(57) ABSTRACT

A motor driving device includes a housing unit, a capacitor module, and a driving module. The housing unit includes a first compartment and a second compartment. The capacitor module is detachably mounted in the first compartment and includes a first circuit board, at least one capacitor electrically connected to the first circuit board, and two first conducting members electrically connected to the first circuit board. The driving module is mounted in the second compartment and includes a second circuit board and two second conducting members that are electrically connected to the second circuit board and that are respectively, electrically and detachably connected to the first conducting members.

3 Claims, 7 Drawing Sheets

MOTOR DRIVING DEVICE

CROSS-REFERENCE TO RELATED APPLICATION

This application claims priority to Taiwanese Patent Application No. 107116690 filed on May 16, 2018.

FIELD

The disclosure relates to a driving device, more particularly to a motor driving device.

BACKGROUND

Capacitors are widely used in electronic circuits for providing different functions according to various requirements in electronic circuits. No matter what function the capacitors provide in electronic circuits, the capacitors are charged and discharged repeatedly and thus service life of the capacitors is relatively short as compared to the remaining electronic components in electronic circuits. Once any one of the capacitors in an electronic circuit is broken or malfunctioned, the electronic circuit cannot operate properly.

Generally, capacitors are mounted on electronic circuits using surface-mount technology (SMT) or through hole technology. When replacement of broken capacitors is required, a technician uses specific tools to detach the broken capacitors from electronic circuits and to replace the same with normally operated capacitors. Thus, it is relatively troublesome and difficult for users of the electronic circuits to replace broken capacitors.

SUMMARY

Therefore, an object of the disclosure is to provide a motor driving device that is relatively simple for users to replace broken capacitors by themselves.

According to one aspect of the disclosure, a motor driving device is provided. The motor driving device includes a housing unit, a capacitor module, and a driving module. The housing unit includes a first compartment and a second compartment. The capacitor module is detachably mounted in the first compartment and includes a first circuit board, at least one capacitor electrically connected to the first circuit board, and two first conducting members electrically connected to the first circuit board. The driving module is mounted in the second compartment and includes a second circuit board and two second conducting members that are electrically connected to the second circuit board and that are respectively, electrically and detachably connected to the first conducting members.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
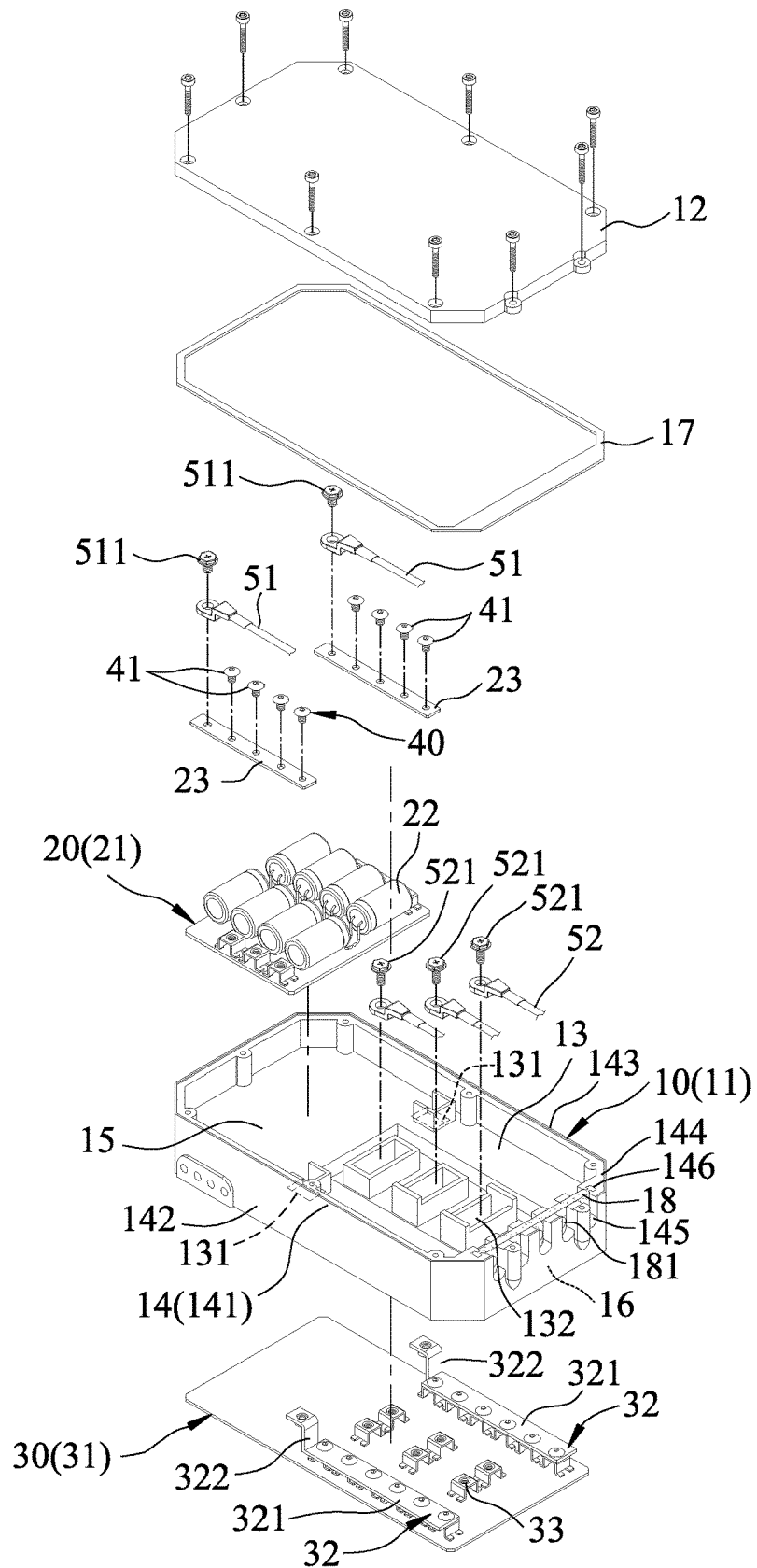
FIG. 1 is a partly exploded perspective view of a motor driving device according to a first embodiment of the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
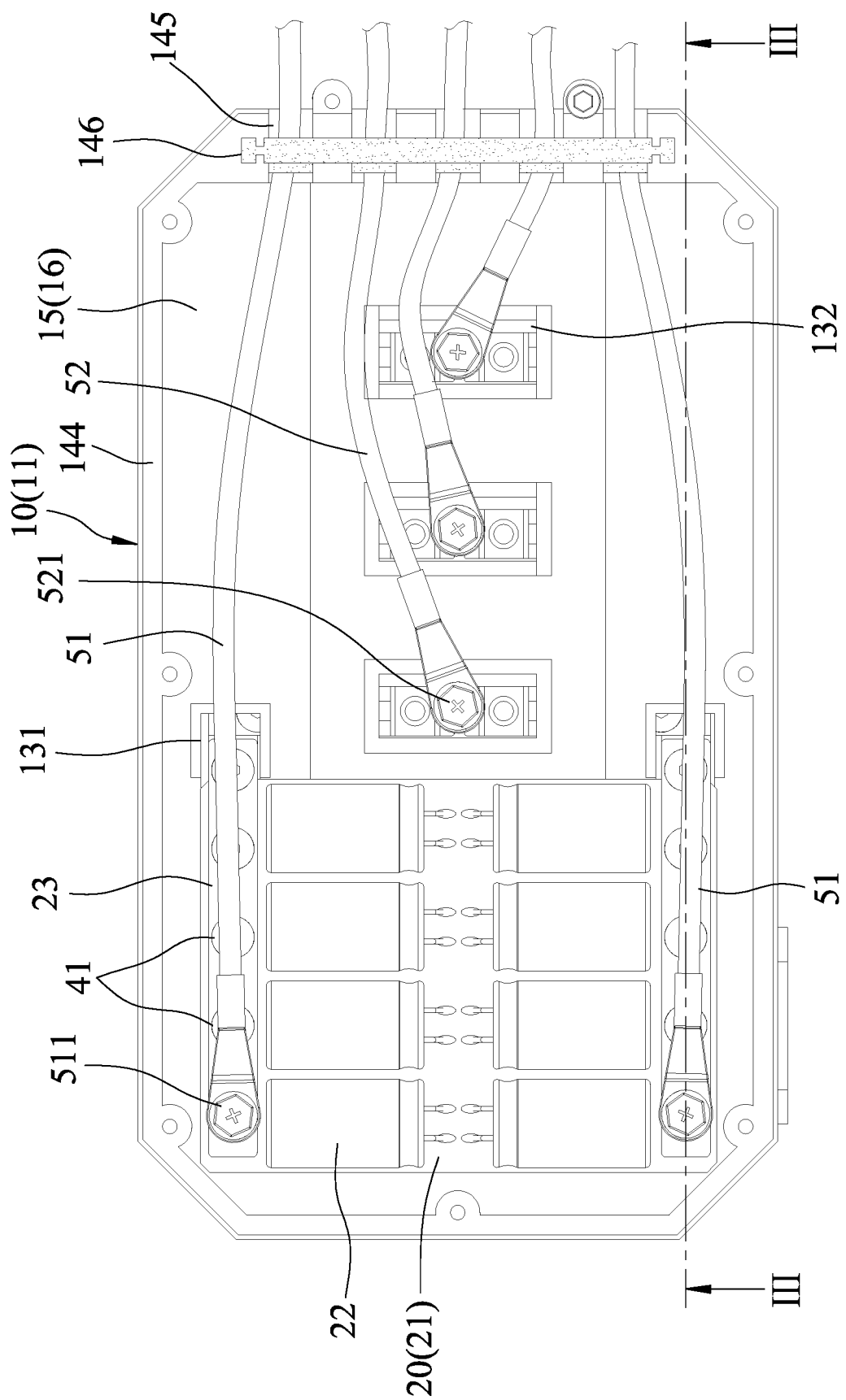
FIG. 2 is a schematic top view of the first embodiment.
Figure 3:
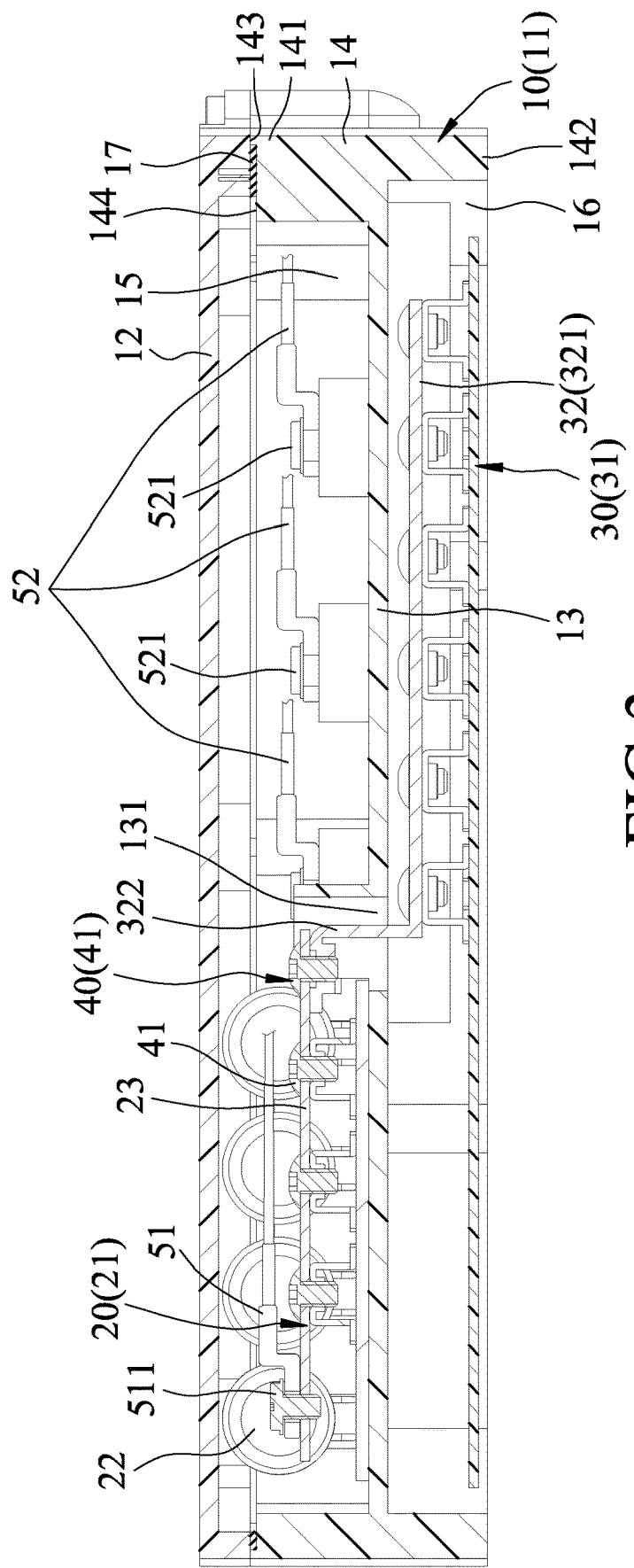
FIG. 3 is a sectional view taken along line in FIG. 2.

Referring to FIGS. 1-3, a motor driving device according to a first embodiment of the present disclosure is shown. The driving device is electrically connected between an external power source (not shown) and a load, for example, a three-phase motor (not shown). The driving device includes a housing unit 10, a capacitor module 20, a driving module 30 and a fastening unit 40.

The housing unit 10 includes a main housing 11 and a cover 12 fastened to the main housing 11. The main housing 11 includes a partition plate 13 and a surrounding wall 14. The surrounding wall 14 is connected to and surrounds a periphery of the partition plate 13 and has an upper surrounding portion 141 and a lower surrounding portion 142 divided by the partition plate 13. The partition plate 13, the upper surrounding portion 141 and the cover 12 cooperate with one another to define a first compartment 15 thereamong. The partition plate 13 cooperates with the lower surrounding portion 142 to define a second compartment 16.

The upper surrounding portion 141 has a top end surface 143, an upwardly facing seal-supporting surface 144 adjacent to and slightly lower than the top end surface 143, a plurality of slot units 145 and a slit 146. Each of the slot units 145 extends downwardly from the seal-supporting surface 144 toward the lower surrounding portion 142, is in spatial communication with the first compartment 15 and the ambient surroundings and is adapted for a respective one of electric cables 51, 52 to pass therethrough. The slit 146 extends downwardly from the seal-supporting surface 144 toward the lower surrounding portion 142 and is in spatial communication with the slots 145. Each of the slots units 145 is divided into two halves by the slit 146. The partition plate 13 is formed with two openings 131 in spatial communication with the first compartment 15 and second compartment 16, and three through holes 132 in spatial communication with the first compartment 15 and second compartment 16. The housing unit 10 further includes a leak-proof seal 17 sealingly disposed between the main housing 11 and the cover 12 and disposed on and above the seal-supporting surface 144, and a sealing member 18 embedded in the slit 146. The sealing member 18 is formed with a plurality of through holes 181, which correspond respectively in position to the slots 145 and each of which is adapted to allow a corresponding one of the electric cables 51, 52 to sealingly extend therethrough.

The capacitor module 20 is detachably mounted in the first compartment 15 and includes a first circuit board 21 disposed on the partition plate 13, a plurality of capacitors 22 electrically connected to the first circuit board 21, and two first conducting members 23 electrically connected to the first circuit board 21.

The driving module 30 is mounted in the second compartment 16 and includes a second circuit board 31, two second conducting members 32 and three phase line connectors 33. The phase line connectors 33 are electrically connected to the second circuit board 31. The second conducting members 32 are electrically connected to the second circuit board 31 and are respectively, electrically and detachably connected to the first conducting members 23. Specifically, each of the second conducting members 32 includes a straight positioning segment 321 that is electrically connected to the second circuit board 31, and an extending segment 322 that is connected to the positioning segment 321, that is inverted-L-shaped, that extends into a respective one of the openings 131 of the partition plate 13, and that is electrically connected to a respective one of the first conducting members 23. The phase line connectors 33 extend into the through holes 132 of the partition plate 13, respectively. The driving module 30 is configured to drive the three-phase motor connected thereto. Note that the feature of the present disclosure does not reside in the detail of how the driving module 30 drives the three-phase motor, further details of the same are thus omitted.

The fastening unit 40 includes a plurality of fastening members 41 made of conductive materials, and detachably and electrically interconnecting the first conducting members 23 and the second conducting members 32.

As shown in FIGS. 1 to 3, to assemble the motor driving device, after the capacitor module 20 and the driving module 30 are respectively mounted in the first compartment 15 and the second compartment 16, the first conducting members 23 are fastened to the second conducting members 32 by the fastening members 41. Subsequently, the electric cables 51 that are connected to the external power source (not shown) are fastened respectively to the first conducting members 23 by two screws 511 according to functional requirement of the load, e.g. three-phase motor, connected to the motor driving device. Then, the electric cables 52 are fastened respectively to the phase line connectors 33 and are inserted respectively through the respective one of the slot units 145. Finally, the sealing member 18, the leak-proof seal 17 and the cover 12 are sequentially mounted on the main housing 11 and the cover 12 is secured on the main housing 11 by some fastening members such as screws. Note that the first circuit board 21 and the second circuit board 31 may be mounted to the housing unit 10 by various fastening elements such as screws and resilient hooks cooperating with mounting holes, and the present disclosure is not limited to the disclosure herein.

In this way, when the capacitors 22 of the capacitor module 20 are broken or malfunctioned and replacement of the capacitor module 20 is required, after the fastening members securing the cover 12 to the main housing 11 is removed, the cover 12 is removed, the leak-proof seal 17 is removed from the housing unit 11 and the screws 511 are loosened to allow the electric cables 51 to be detached from the first conducting members 23. The fastening members 41 are then loosened to allow the first conducting members 23 to be respectively removed from the second conducting members 32, and thus the capacitor module 20 can be removed from the first compartment 15 and be replaced in a relatively simple manner.

As compared to conventional capacitor replacement approach involving use of specific tools, the structure of the motor driving device of the present disclosure provides a relatively easy approach for the users to replace the capacitor module 20. In one embodiment, all the capacitors 22 of the motor driving device of the present disclosure are integrated in the capacitor module 20. Since service life of the capacitors are usually shorter than the remaining electronic components such as the driving module 30 in the motor driving device, the design of separating all the capacitors 22 from the remaining electronic components provides a cost effective way for repairing the motor driving device without replacing components provided with capacitors.

Figure 4:
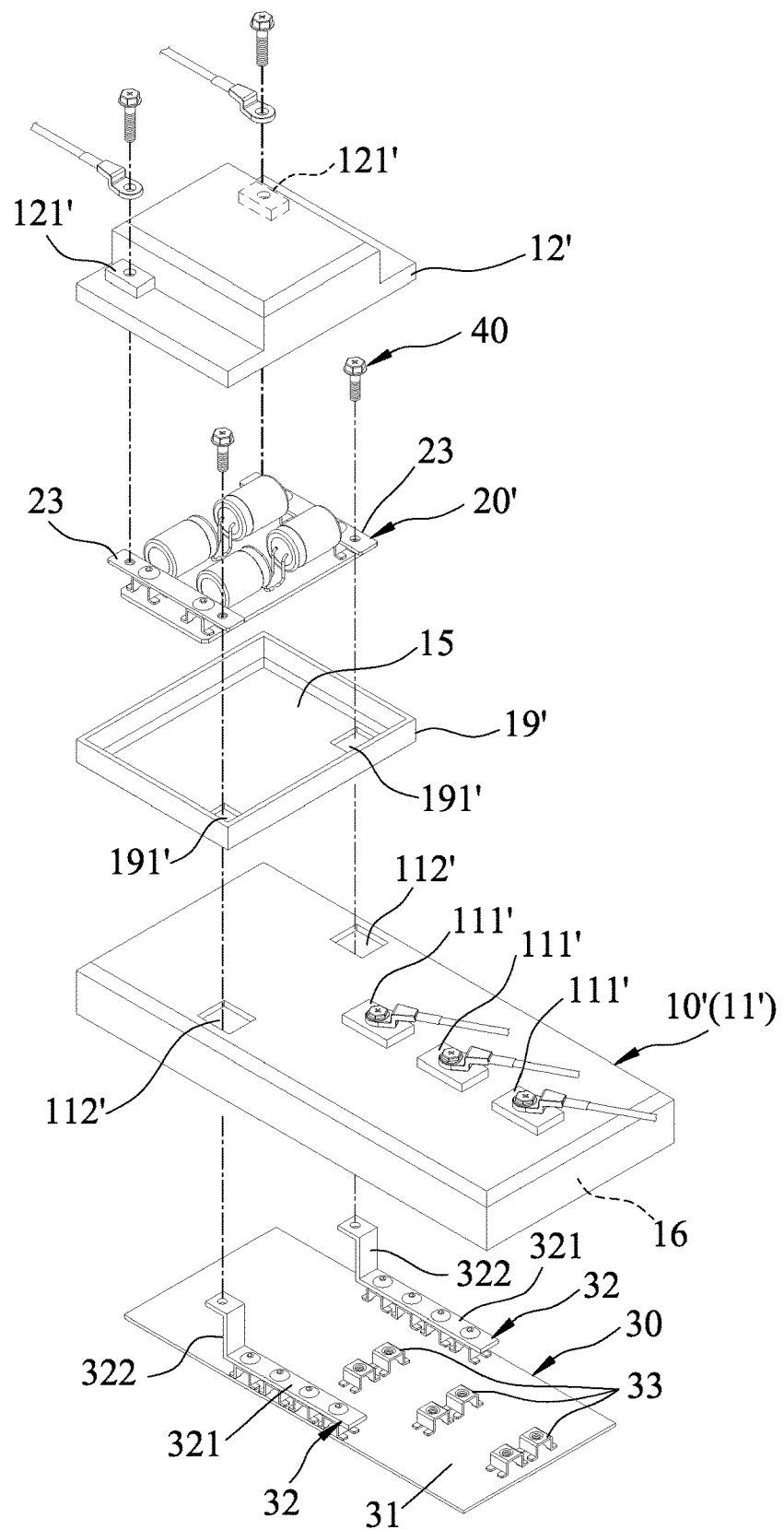
FIG. 4 is a partly exploded perspective view of a motor driving device according to a second embodiment of the present disclosure.
Figure 5:
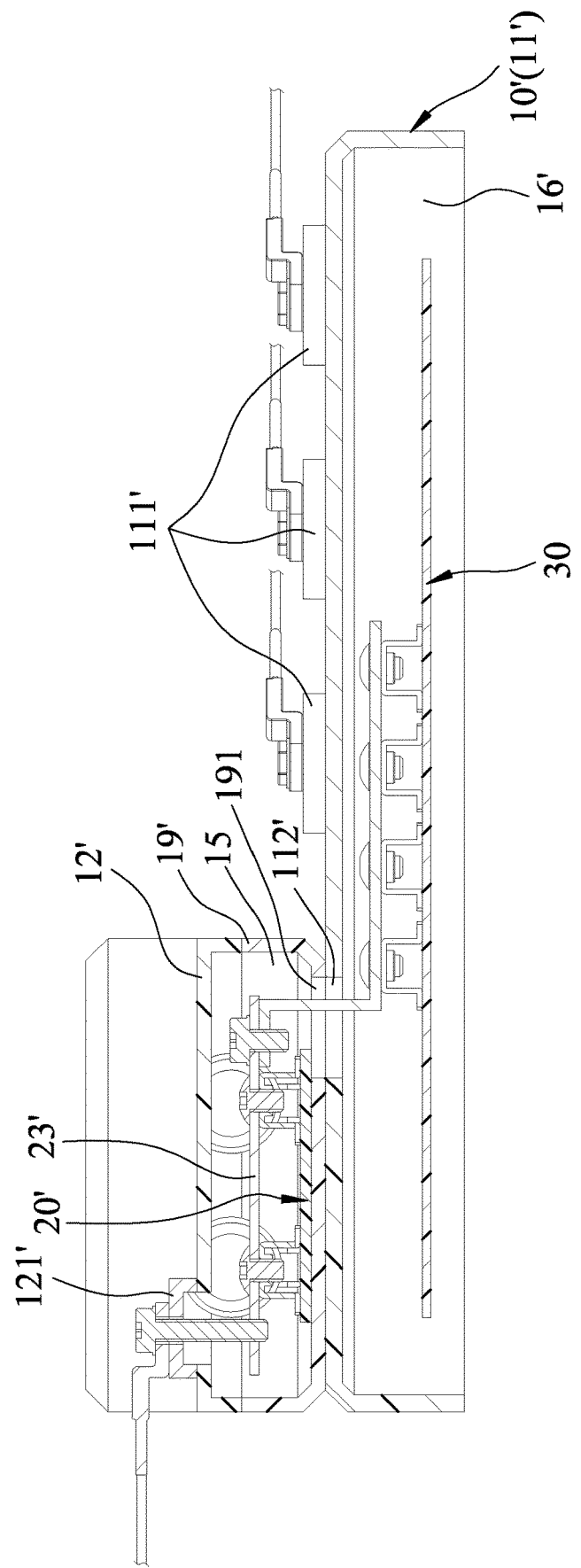
FIG. 5 is a sectional view of the second embodiment.

Referring to FIGS. 4 and 5, the driving device according to a second embodiment of the present disclosure is shown. In this embodiment, the motor driving device includes a housing unit 10', a capacitor module 20', a driving module 30 and a fastening unit 40. The difference between the second embodiment and the first embodiment resides in the following. The housing unit 10' includes a main housing 11', an auxiliary housing 19' connected to the main housing 11', and a cover 12' detachably mounted to the auxiliary housing 19'. The auxiliary housing 19' cooperates with the cover 12' to define the first compartment 15. The main housing 11' defines the second compartment 16 therein. The cover 12' includes two connecting terminals 121' electrically and respectively connected to the first conducting members 23 and adapted to be connected to external power sources (not shown). The main housing 11' includes three phase line terminals 111' electrically connected to the second circuit board 31 at the three phase line connectors 33, respectively.

In this embodiment, the main housing 11' and the auxiliary housing 19' are manufactured separately and are integrally connected to each other. The auxiliary housing 19' is formed with two first through holes 191'. The main housing 11' is formed with two second openings 112' corresponding in position to and communicate with the first through holes 191', respectively.

Each of the second conducting members 32 includes a positioning segment 321 that is electrically connected to the second circuit board 31 and an extending segment 322 that is connected to the positioning segment 321, that extends through a respective one of the second openings 112' of the main housing 11' and a corresponding one of the first through holes 191' of the auxiliary housing 19', and that is electrically connected to a respective one of the first conducting members 23. Note that the leak-proof seal 17, the sealing member 18 shown in FIG. 1 are omitted in this embodiment.

Figure 6:
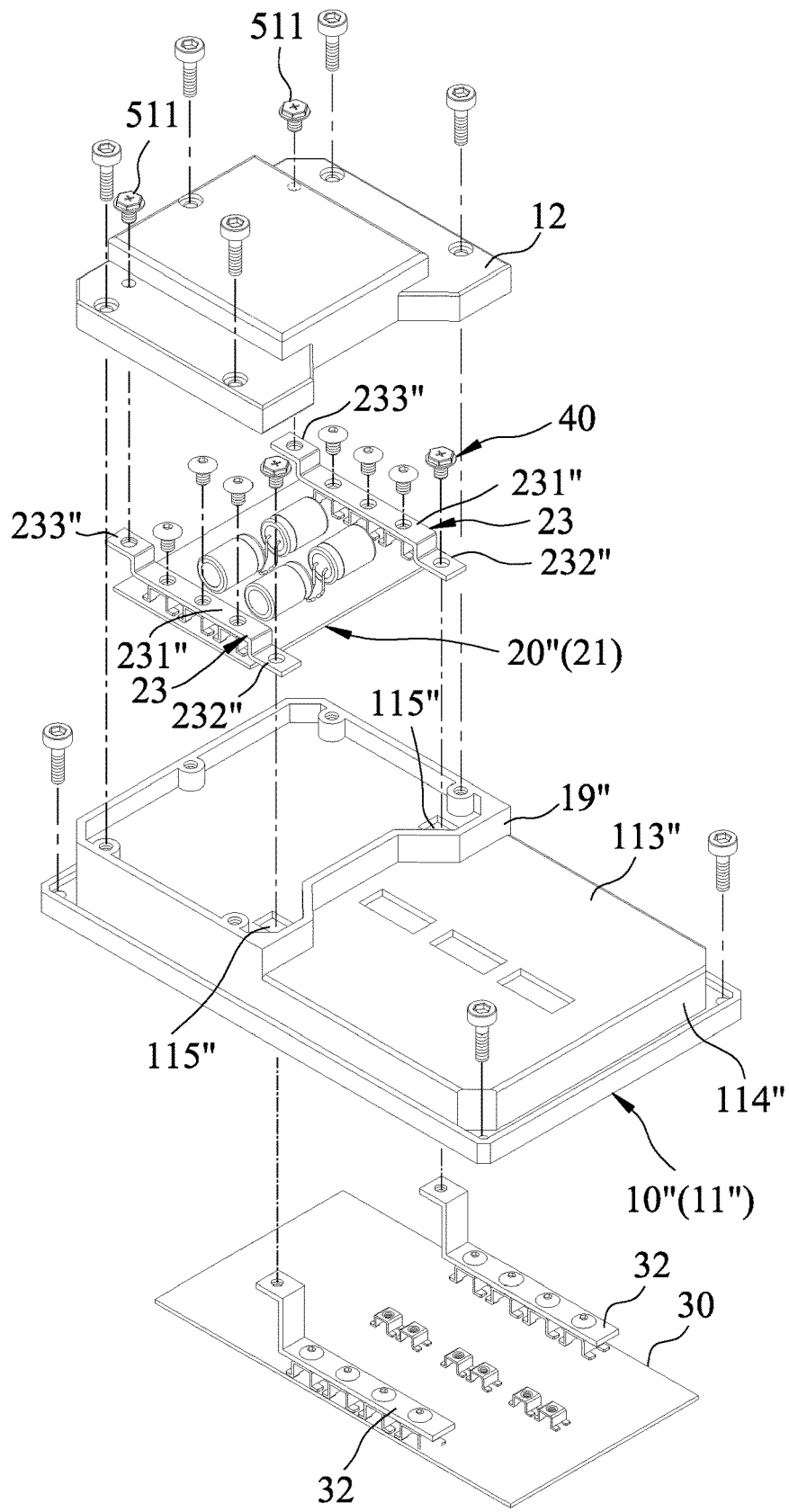
FIG. 6 is a partly exploded perspective view of a motor driving device according to a third embodiment of the present disclosure.

Referring to FIG. 6, the driving device according to a third embodiment of the present disclosure is shown. The motor driving device of the third embodiment includes a housing unit 10", a capacitor module 20", a driving module 30 and a fastening unit 40. The difference between the third embodiment and the second embodiment resides in the following.

In the third embodiment, the main housing 11" and the auxiliary housing 19' of the housing unit 10' are integrally formed. The main housing 11" includes an upper plate 113" connected integrally to the auxiliary housing 19" and formed with two slots 115" that are in spatial communication with the first compartment 15 and the second compartment 16, and a periphery wall 114" surrounding and connected to a periphery of the upper plate 113". The first circuit board 21 of the capacitor module 20 is disposed on the upper plate 113".

Each of the first conducting members 23 of the capacitor module 20 includes a straight segment 231", a first bent segment 232" and a second bent segment 233". For each of the first conducting members 23, the straight segment 231"

is electrically connected to the first circuit board 21. For each of the first conducting members 23, the first bent segment 232" is inverted-L-shaped, is connected to one end of the straight segment 231", extends through a respective one of the slots 115" and is electrically connected to a respective one of the second conducting members 32. Also for each of the first conducting members 23, the second bent segment 233" is connected to the other end of the straight segment 231" and is adapted to be electrically connected to a respective one of fastening members 511 extending from the cover 12, electrically connected to a corresponding one of the external power sources, and fastening the cover 12 to the main housing 11".

Figure 7:
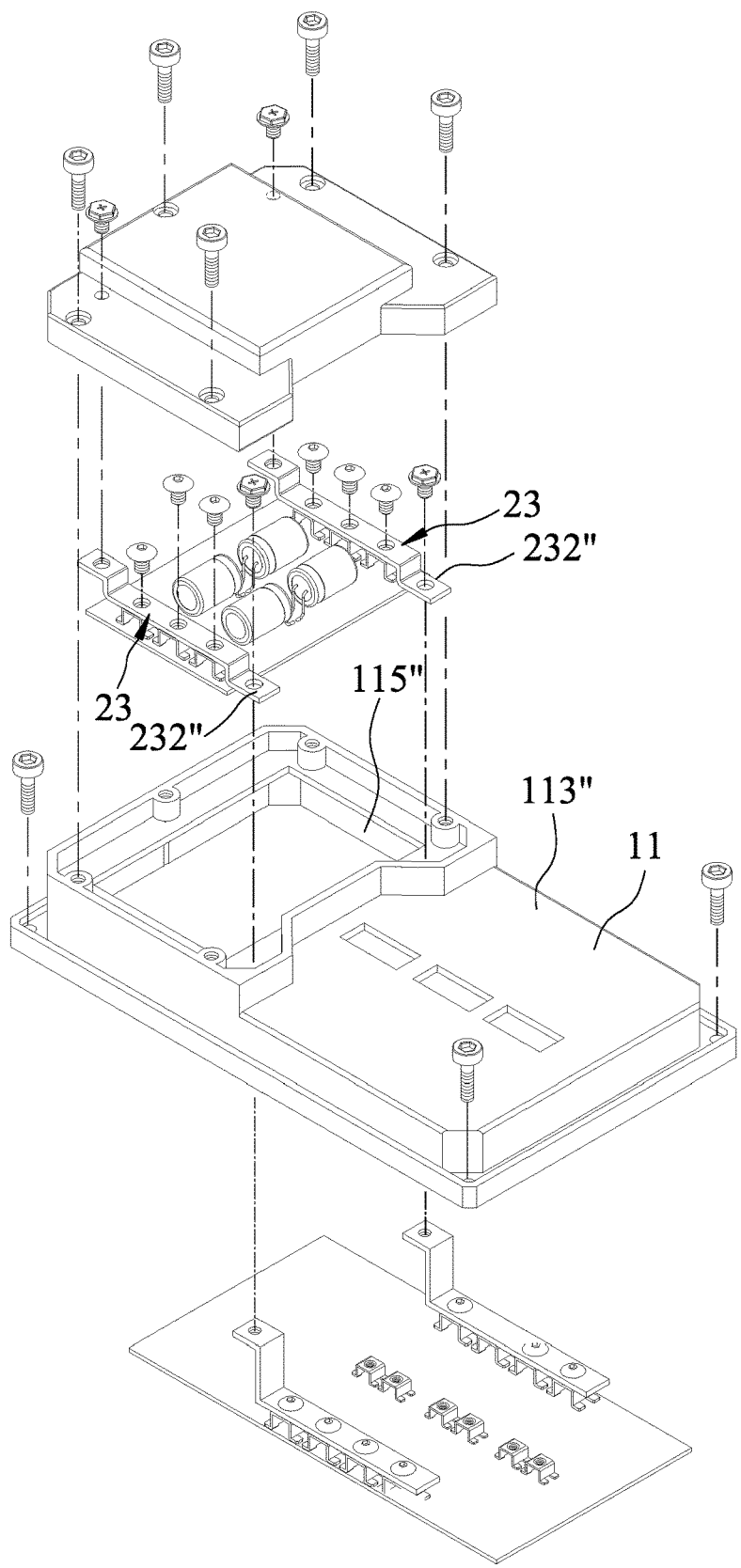
FIG. 7 is a partly exploded perspective view of a motor driving device according to a fourth embodiment of the present disclosure.

Referring to FIG. 7, the driving device according to a fourth embodiment of the present disclosure is similar to the third embodiment. The difference between the third embodiment and the fourth embodiment resides in that the upper plate 113" of the main housing 11 is formed with only one slot 115" that allows the first bent segments 232" of the first conducting members 23 to extend therethrough. The second to fourth embodiments possess the same advantages as the first embodiment.

To sum up, the structure of the motor driving device of the present application makes replacement of the capacitor module 20 relatively simple without using specific tools as mentioned in the background section. The capacitor module 20 can be easily detached from the first compartment 15 and then be replaced when the capacitor 22 are broken or malfunctioned.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A motor driving device, comprising a housing unit including a first compartment and a second compartment, and formed with two openings; a capacitor module detachably mounted in said first compartment and including a first circuit board, at least one capacitor electrically connected to said first circuit board, and two first conducting members electrically connected to said first circuit board; and a driving module mounted in said second compartment and including a second circuit board and two second conducting members that are electrically connected to said second circuit board and that are respectively, electrically and detachably connected to said first conducting members, each of said second conducting members including an extending segment extending through a respective one of said openings of said housing unit; wherein said housing unit further includes a main housing and a cover fastened to said main housing, said main housing including a partition plate and a surrounding wall that is connected to and surrounds a periphery of said partition plate and that has an upper surrounding portion and a lower surrounding portion divided by said partition plate, said partition plate, said upper surrounding portion and said cover cooperating with one another to define said first compartment, said partition plate cooperating with said lower surrounding portion to define said second compartment, said upper surrounding portion being formed with a plurality of slot units, each of which is in spatial communication with said first compartment and ambient surroundings and each of which is adapted for an electric cable to pass therethrough, said partition plate being formed with said openings, each of said second conducting members further including a positioning segment that is electrically connected to said second circuit board, wherein for each of said second conducting members, said extending segment is connected to said positioning segment, extends into the respective one of said openings of said partition plate, and is electrically connected to a respective one of said first conducting members.

2. The motor driving device as claimed in claim 1, wherein said housing unit further includes a leakproof seal sealingly disposed between said main housing and said cover, and a sealing member mounted on said main housing and formed with a plurality of through holes, which correspond respectively in position to said slot units and each of which is adapted to allow the electric cable to sealingly extend therethrough and to electrically connected to said first conducting members.

3. The motor driving device as claimed in claim 1, further comprising a fastening unit that includes a plurality of fastening members made of conductive materials, and detachably and electrically interconnecting said first conducting members and said second conducting members.

* * * * *